United States Patent
Oka et al.

(10) Patent No.: US 11,051,399 B2
(45) Date of Patent: Jun. 29, 2021

(54) FLEXIBLE PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Yoshio Oka, Osaka (JP); Yoshifumi Uchita, Shiga (JP); Yoshiro Adachi, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/618,253

(22) PCT Filed: Jun. 25, 2018

(86) PCT No.: PCT/JP2018/023921
§ 371 (c)(1),
(2) Date: Nov. 29, 2019

(87) PCT Pub. No.: WO2019/035278
PCT Pub. Date: Feb. 21, 2019

(65) Prior Publication Data
US 2021/0037642 A1 Feb. 4, 2021

(30) Foreign Application Priority Data
Aug. 14, 2017 (JP) .............................. JP2017-156507

(51) Int. Cl.
*H05K 1/02* (2006.01)

(52) U.S. Cl.
CPC .................................. *H05K 1/0281* (2013.01)

(58) Field of Classification Search
CPC .......................................... H05K 1/0277–0283
See application file for complete search history.

(56) References Cited

U.S. PATENT DOCUMENTS

| 5,309,316 A | 5/1994 | Yagi et al. | |
| 2010/0326705 A1* | 12/2010 | Chuo | H05K 1/118 174/254 |
| 2015/0252990 A1* | 9/2015 | Liu | F21V 23/005 362/308 |

FOREIGN PATENT DOCUMENTS

| JP | H04-099863 U | 8/1992 |
| JP | H05-152039 | 6/1993 |
| (Continued) | | |

OTHER PUBLICATIONS

Japanese Office Action for 2017-156507 dated Nov. 10, 2020.
International Search Report for PCT/JP2018/023921 dated Aug. 21, 2018.

*Primary Examiner* — Jeremy C Norris
(74) *Attorney, Agent, or Firm* — IPUSA, PLLC

(57) ABSTRACT

A flexible printed circuit board according to one aspect of the present invention includes a base film having an insulating property and a conductive pattern laminated on one surface of the base film, and has a terminal connecting area toward one end edge of the conductive pattern, the flexible printed circuit board including a reinforcement member laminated on another surface of the base film and situated opposite at least the terminal connecting area, wherein a thickness of the reinforcement member increases toward the one end edge in a stepwise or gradual manner.

8 Claims, 2 Drawing Sheets

(56) References Cited

FOREIGN PATENT DOCUMENTS

| | | |
|---|---|---|
| JP | H05-235498 | 9/1993 |
| JP | H06-216487 | 8/1994 |
| JP | 2005-294746 | 10/2005 |
| JP | 2012-174855 | 9/2012 |
| JP | 2016-018787 | 2/2016 |
| WO | 2010/004439 | 1/2010 |

* cited by examiner

FLEXIBLE PRINTED CIRCUIT BOARD

TECHNICAL FIELD

The disclosures herein relate to a flexible printed circuit board. The present application claims priority to Japanese patent application No. 2017-156507 filed on Aug. 14, 2017, and the entire contents of this Japanese patent application are hereby incorporated by reference.

BACKGROUND ART

In recent years, various flexible printed circuit boards have been used in the field of electronic devices due to the need for size reduction and weight reduction of electronic devices. As such flexible printed circuit boards, a flexible printed circuit board is generally used that includes a base film serving as a base and a conductive pattern made of copper foil or the like laminated to the surface of the base film.

Such a flexible printed circuit board is flexible. For this reason, the connection terminals of a flexible printed circuit board for connection to a conductor pattern of an electronic device have a reinforcement plate serving as a reinforcement member and laminated on an outer face thereof, for example, for the purpose of preventing bending or warpage (see WO 2010/004439).

RELATED-ART DOCUMENTS

Patent Document

[Patent Document 1] International Publication NO. 2010/004439

SUMMARY OF THE INVENTION

A flexible printed circuit board according to one aspect of the present disclosures includes a base film having an insulating property and a conductive pattern laminated on one surface of the base film, and has a terminal connecting area toward one end edge of the conductive pattern, the flexible printed circuit board including a reinforcement member laminated on another surface of the base film and situated opposite at least the terminal connecting area, wherein a thickness of the reinforcement member increases toward the one end edge in a stepwise or gradual manner.

MODE FOR CARRYING OUT THE INVENTION

Figure 1:
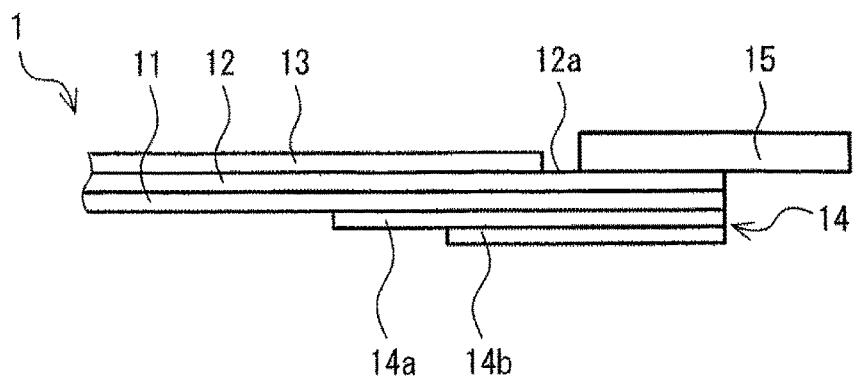
FIG. 1 is a schematic side elevation view of a flexible printed circuit board according to one aspect of the present disclosures.

Problem to be Solved by the Present Disclosures

In a flexible printed circuit board reinforced by a reinforcement member, stress is likely to be concentrated on the boundary between the place where the reinforcement member is laminated and the place where the reinforcement member is not laminated. Fracture is thus likely to occur at this boundary.

Particularly noted is the fact that, with a recent progress in the size reduction of electronic devices, the conductive patterns of flexible printed circuit boards have become narrower and narrower, and, also, the bending radius of flexible printed circuit boards has become smaller and smaller. Because of this, a fracture in the conductive patterns of flexible printed circuit boards resulting from stress concentration has become a larger problem.

The present disclosures are made in consideration of the above-noted circumstances, and are directed to providing a flexible printed circuit board that can prevent fractures caused by stress concentration resulting from the presence of a reinforcement member.

Advantage of the Present Disclosures

The flexible printed circuit board of the present disclosures prevents fractures caused by stress concentration resulting from the presence of a reinforcement member.

DESCRIPTION OF EMBODIMENTS OF THE PRESENT DISCLOSURES

A flexible printed circuit board according to one aspect of the present disclosures includes a base film having an insulating property and a conductive pattern laminated on one surface of the base film, and has a terminal connecting area toward one end edge of the conductive pattern, the flexible printed circuit board including a reinforcement member laminated on the opposite surface of the base film and situated opposite at least the terminal connecting area, wherein a thickness of the reinforcement member increases toward the one end edge in a stepwise or gradual manner.

The flexible printed circuit board is such that the thickness of the reinforcement member increases toward the one end edge in a stepwise or gradual manner. The flexible printed circuit board is thus strengthened in a stepwise or gradual manner toward the one end edge in the terminal connecting area where the reinforcement member is laminated opposite thereto. Strengthening the flexible printed circuit board gradually toward the one end edge makes it easier to disperse stress, so that such a flexible printed circuit board can prevent factures caused by stress concentration resulting from the presence of a reinforcement member.

The reinforcement member may include a plurality of laminated reinforcement layers, and the thickness may be increased in a stepwise manner based on a number of laminated layers among the reinforcement layers. In this manner, implementing the reinforcement member as a plurality of reinforcement layers and increasing the thickness in a stepwise manner by increasing a number of laminated reinforcement layers allow the reinforcement member to be readily and cost-efficiently manufactured.

The reinforcement layers may be two layers including an inner layer and an outer layer, and the outer layer may cover the inner layer. In this manner, implementing the reinforcement member in such a manner as to have the outer layer covering the inner layer causes an end edge of the inner layer not to be exposed to the outside, thereby reducing a step edge on the opposite surface of the flexible printed circuit board. The reinforcement member is thus made unlikely to be peeled.

A coverlay may be laminated on one surface of the base film or the conductive pattern, except on the terminal connecting area, and an end edge of the coverlay situated toward the above-noted one end edge may not overlap end edges of the reinforcement layers situated toward the opposite end edge of the conductive pattern in a plan view. In this manner, ensuring that the noted end edge of the coverlay and the noted end edges of the reinforcement layers do not overlap in a plan view allows stress to be more effectively dispersed, thereby improving a fracture preventive effect.

One or more connection terminals may be disposed on the terminal connecting area, and the connection terminals may be made of a metal. The effect to prevent stress concentration is particularly high with respect to the flexible printed circuit board connected with the high-stiffness connection terminals made of a metal.

Here, the phrase "the thickness of the reinforcement member increases toward the one end edge in a stepwise manner" refers to the fact that the thickness of the reinforcement member changes in a stepwise manner so as to increase toward the one end edge. Further, the phrase "the thickness of the reinforcement member increases toward the one end edge in a gradual manner" refers to the fact that the thickness of the reinforcement member stays the same or increases toward the one end edge, i.e., does not decrease in any part toward the one end edge.

DETAILS OF EMBODIMENTS OF THE PRESENT DISCLOSURES

In the following, embodiments of the flexible printed circuit board according to the present disclosures will be described with reference to the drawings.

First Embodiment

Figure 2:
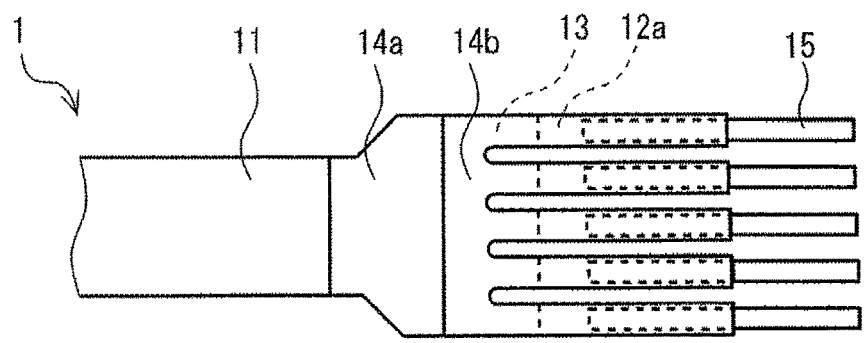
FIG. 2 is a schematic back view of the flexible printed circuit board of FIG. 1.

A flexible printed circuit board 1 according to one aspect of the present disclosures illustrated in FIG. 1 and FIG. 2 includes a base film 11 having an insulating property, a conductive pattern 12 laminated to one surface of the base film 11, a coverlay 13 laminated to the one surface of the base film 11 or conductive pattern 12, and a reinforcement member 14 laminated to the opposite surface of the base film 11.

The flexible printed circuit board 1 has a terminal connecting area 12a on and toward one end edge of the conductive pattern 12, and has a plurality of connection terminals 15 on the terminal connecting area 12a.

<Base Film>

The base film 11 is a member that supports the conductive pattern 12, and is a structural material that secures the strength of the flexible printed circuit board 1.

The main component of the base film 11 may be a soft material such as polyimide, liquid crystal polymer such as liquid crystal polyester, polyethylene terephthalate, polyethylene naphthalate, polyphenylene ether, or fluorine resin, a hard material such as paper phenol, paper epoxy, a glass composite, glass epoxy, or a glass substrate, or a rigid flexible material composed of a soft material and a rigid material. Among these, polyimide is preferable due to its excellent heat resistance. The base film 11 may be porous, or may include fillers, additives, and the like.

Although the base film 11 is not limited to a particular thickness, the lower limit of an average thickness of the base film 11 is preferably 5 μm and more preferably 12 μm. The upper limit of an average thickness of the base film 11 is preferably 500 μm and more preferably 200 μm. An average thickness of the base film 11 less than the lower limit may create a risk that the strength of the base film 11 is insufficient. Further, an average thickness of the base film 11 exceeding the upper limit may create a risk that the flexibility of the flexible printed circuit board 1 is insufficient.

<Conductive Pattern>

The conductive pattern 12 constitutes structures such as an electrical interconnect structure, the ground, shields, and the like.

The conductive pattern 12 is not limited to a particular material as long as the material has electrical conductivity. Examples include metals such as copper, aluminum, and nickel. In general, copper is used due to its relatively low price and high conductivity. The conductive pattern 12 may also be plated on the surface thereof.

The lower limit of an average thickness of the conductive pattern 12 is preferably 2 μm and more preferably 5 μm. Further, the upper limit of an average thickness of the conductive pattern 12 is preferably 100 μm and more preferably 70 μm. In the case of an average thickness of the conductive pattern 12 being less than the lower limit, there may be a risk that the conductivity of the conductive pattern 12 is insufficient. Conversely, in the case of an average thickness of the conductive pattern 12 exceeding the upper limit, there may be a risk that the flexible printed circuit board 1 is needlessly thick.

The terminal connecting area 12a of the flexible printed circuit board 1 situated toward the one end edge of the conductive pattern 12 is an area for use in connection with another electronic device through the connection terminals 15, which will be described later. In the terminal connecting area 12a, the coverlay 13, which will be described later, is nonexistent.

The terminal connecting area 12a has a comb shape with the teeth extending toward the one end edge as illustrated in FIG. 1. Each tooth portion of the comb teeth is provided with one connection terminal 15. As described above, the shape of the flexible printed circuit board 1 at the above-noted terminal connecting area 12a may be configured into a comb shape, which makes it less likely for stress applied to the terminal connecting area 12a by any given connection terminal 15 to be applied to the terminal connecting area 12a of adjacent connection terminals 15. This reduces stress applied through the connection terminals 15 to the flexible printed circuit board 1.

The size of each tooth portion of the terminal connecting area 12a is determined by the size of the connection terminals 15, and may have an average width of 0.5 mm or more and 3 mm or less and an average length of 3 mm or more and 50 mm or less. The number of tooth portions is determined in accordance with the number of connection terminals 15. Normally, the width of the base film 11 including the terminal connecting area 12a is constant. Depending on the number of connection terminals 15, however, the circumstance may require a larger width than the width of that part of the base film 11 which is other than the above-noted terminal connecting area 12a. In such a case, as illustrated in FIG. 2, for example, a required number of tooth portions is secured by widening the base film 11 toward the one end edge.

<Coverlay>

The coverlay 13 protects the conductive pattern 12 from external forces, moisture, and the like. The coverlay 13 includes a cover film and an adhesive layer. The coverlay 13 is implemented as the cover film laminated through this adhesive layer to the opposite surface of the conductive pattern 12 from the base film 11.

(Cover Film)

The cover film is not limited to a particular material, and the same or similar material as a resin constituting the base film 11 may be used, for example.

The lower limit of an average thickness of the cover film is preferably 5 μm and more preferably 10 μm. Further, the upper limit of an average thickness of the cover film is preferably 50 μm and more preferably 30 μm. An average thickness of the cover film less than the lower limit may create a risk of insufficient insulation. Conversely, an average thickness of the cover film exceeding the upper limit may create a risk that the flexibility of the flexible printed circuit board 1 is undermined.

(Adhesive Layer)

The adhesive layer serves to secure the cover film on the conductive pattern 12 and on the base film 11. The adhesive layer is not limited to a particular material as long as the material is capable of securing the cover film on the conductive pattern 12 and on the base film 11. Excellent flexibility and excellent heat resistance are preferable property, and examples include polyimide, polyamide, epoxy, butyral, acrylic, and the like. Further, a thermosetting resin is preferable in terms of heat resistance.

Although the adhesive layer of the coverlay 13 is not limited to a particular average thickness, the lower limit of an average thickness of the adhesive layer is preferably 5 μm and more preferably 10 μm, for example. Further, the upper limit of an average thickness of the adhesive layer is 100 μm and more preferably 80 μm, for example. An average thickness of the adhesive layer less than the lower limit may create a risk of insufficient adhesion. Conversely, an average thickness of the adhesive layer exceeding the upper limit may create a risk that the flexibility of the flexible printed circuit board 1 is undermined.

<Reinforcement Member>

The reinforcement member 14 is laminated on the opposite surface of the base film 11 and situated opposite at least the terminal connecting area 12a. Further, the reinforcement member 14 is comprised of two reinforcement layers, i.e., an inner layer 14a laminated on the opposite surface of the base film 11 and an outer layer 14b laminated on the surface of the inner layer 14a opposite the base film 11.

The reinforcement member 14 is made of a material having excellent mechanical strength. Especially, a material having a resin as a main component may be suitable as the material of the reinforcement member 14. The use of the reinforcement member 14 having a resin as a main component enables the reinforcement of the flexible printed circuit board 1 while securing flexibility. Examples of the above-noted resin include epoxy resin, polyester, polyimide, and the like. Further, as the material of the reinforcement member 14, a resin reinforced with glass fibers or paper such as a glass epoxy resin may be used. Herein, the term "main component" refers to a component accounting for the highest content, and refers to a component with a content of 50 wt % or more.

End edges of the inner layer 14a and the outer layer 14b situated on the same side as the above-noted one end edge coincide with the edge of the base film 11 situated on the same side as the noted one end edge. The average length of the inner layer 14a is greater than the average length of the outer layer 14b. The end edge of the outer layer 14b situated on the same side as the opposite end edge of the conductive pattern 12 is positioned closer to the noted one end edge than is the end edge of the inner layer 14a situated on the same side as the noted opposite end edge. With this arrangement, the reinforcement member 14 has a laminated number of layers increasing from 1 to 2 toward the noted one end edge, so that the thickness of the reinforcement member 14 increases toward the noted one end edge in a stepwise manner. In this manner, implementing the reinforcement member as two reinforcement layers and increasing the thickness of the reinforcement member in a stepwise manner by increasing a number of laminated reinforcement layers allow the reinforcement member 14 to be readily and cost-efficiently manufactured.

Further, the respective end edges of the inner layer 14a and the outer layer 14b on the same side as the noted opposite end edge may not overlap, in a plan view, the end edge of the coverlay 13 situated on the same side as the noted one end edge. In this manner, ensuring that the noted end edge of the coverlay and the noted end edges of the reinforcement layers do not overlap in a plan view allows stress to be more effectively dispersed, thereby improving a fracture preventive effect.

Further, the end edge of the outer layer 14b on the same side as the noted opposite end edge may be positioned further toward the direction of the noted opposite end edge than are these end edges of the connection terminals 15 which are situated on the same side as the noted opposite end edge. Further, the end edge of the outer layer 14b on the same side as the noted opposite end edge may be positioned further toward the direction of the noted opposite end edge than is the end edge of the coverlay 13 situated on the same side as the noted one end edge. Positioning the edge of the outer layer 14b on the same side as the noted opposite end edge in such an arrangement serves to more reliably protect the portion that is likely to receive stress.

The lower limit of an average thickness of the laminated portion of the reinforcement member 14 (i.e., an average thickness of the portion where the inner layer 14a and the outer layer 14b are laminated) is preferably 100 μm and more preferably 150 μm. Further, the upper limit of an average thickness of the laminated portion of the reinforcement member 14 is preferably 500 μm and more preferably 300 μm. An average thickness of the laminated portion of the reinforcement member 14 less than the above-noted lower limit results in the failure to provide a sufficient reinforcement effect, thereby creating a risk that the flexible printed circuit board 1 is likely to exhibit bending and/or warpage. Conversely, an average thickness of the laminated portion of the reinforcement member 14 exceeding the upper limit creates a risk that the flexible printed circuit board 1 is needlessly thick.

Further, the average thickness of the inner layer 14a and the average thickness of the outer layer 14b are preferably equal. Making an average thickness of the inner layer 14a equal to an average thickness of the outer layer 14b serves to disperse stress more effectively, thereby improving a fracture preventive effect.

The lower limit of an average separation distance between the end edge of the inner layer 14a situated toward the noted opposite end edge and the end edge of the outer layer 14b situated toward the noted opposite end edge is preferably 1 mm and more preferably 3 mm. Further, the upper limit of the average separation distance is preferably 20 mm and more preferably 12 mm. An average separation distance less than the above-noted lower limit creates a risk that stress is not sufficiently dispersed, which fails to provide a sufficient fracture preventive effect.

Conversely, an average separation distance exceeding the above-noted upper limit creates a risk that the structure for increasing the thickness of the reinforcement member 14 on a stepwise manner is difficult to be effectively positioned at the point where stress is likely to be concentrated, which results in an insufficient fracture preventive effect.

The lower limit of an average separation distance between the end edge of the outer layer 14b situated toward on the noted opposite end edge and the end edges of the connection terminals 15 situated toward the noted opposite end edge is preferably 1 mm and more preferably 3 mm. Further, the upper limit of the average separation distance is preferably 20 mm and more preferably 12 mm. An average separation distance lower than the above-noted lower limit creates a risk that the structure for increasing the thickness of the reinforcement member 14 on a stepwise manner is difficult to be effectively positioned at the point where stress is likely to be concentrated, which results in an insufficient fracture preventive effect. Conversely, an average separation distance exceeding the above-noted upper limit creates a risk that stress is not sufficiently dispersed, which fails to provide a sufficient fracture preventive effect. It may be noted that an average separation distance between the end edge of the inner layer 14a situated toward the noted opposite end edge and the end edge of the outer layer 14b situated toward the noted opposite end edge is preferably equal to an average separation distance between the end edge of the outer layer 14b situated toward the noted opposite end edge and the end edges of the connection terminals 15 situated toward the noted opposite end edge.

Contact between the inner layer 14a and the base film 11 and contact between the outer layer 14b and the inner layer 14a may be secured by an adhesive layer, for example. Alternatively, the inner layer 14a and the outer layer 14b may be formed by coating or the like on the surface of the base film 11 in this order.

In the case of securing the inner layer 14a and the outer layer 14b through an adhesive layer, the adhesive layer is not limited to a particular material as long as the material is capable of securing the reinforcement member 14. The same or similar material as the one used for securing the cover film may be used. The lower limit of an average thickness of the adhesive layer is preferably 5 μm and more preferably 10 μm. Further, the upper limit of an average thickness of the adhesive layer is preferably 100 μm and more preferably 70 μm. An average thickness of the adhesive layer less than the lower limit may create a risk of insufficient adhesion with respect to the reinforcement member 14. Conversely, an average thickness of the adhesive layer exceeding the upper limit creates a risk that the flexible printed circuit board 1 is needlessly thick.

<Connection Terminal>

The connection terminal 15 is a component for connecting the flexible printed circuit board 1 with another electronic device or the like.

The connection terminals 15 are not limited to a particular material as long as the material is electrically conductive. It may suffice for the connection terminals 15 to be made of a metal. The effect to prevent stress concentration is particularly high with respect to the flexible printed circuit board 1 connected with the high-stiffness connection terminals 15 made of a metal. Examples of the above-noted metal include soft copper, brass, phosphor bronze, and the like. The surface of the connection terminals 15 is preferably plated to prevent oxidation. The above-described plating may be Sn plating, Ni plating, Au plating, or the like. Among these, Ni plating, which is low cost and excellent in corrosion resistance, is preferable.

The shape of the above-described connection terminals 15 is determined in accordance with the shape of the terminal of the electronic device or the like that is to be coupled. The shape may be a plate shape or molded three dimensional shape having an average width of 0.5 mm to 3 mm inclusive, an average length of 3 mm to 50 mm inclusive, and an average height of 0.1 mm to 3 mm inclusive.

The connection terminals 15 are mounted on the terminal connecting area 12a to be electrically connected to the conductive pattern 12.

<Method of Making Flexible Printed Circuit Board>

The flexible printed circuit board 1 may be made by a production method including a step of forming a flexible printed circuit board core, a step of forming a reinforcement member, and a step of mounting connection terminals.

(Step of Forming Flexible Printed Circuit Board Core)

A flexible printed circuit board core is formed that includes a base film 11 having an insulating property, a conductive pattern 12 laminated on one surface of the base film 11, and a coverlay 13 laminated on the one surface of the base film 11 or the conductive pattern 12. The specific procedure is as follows.

A conductive layer is formed on one surface of the base film 11.

The conductor layer may be formed by bonding a conductor foil through an adhesive or by a deposition method known in the art, for example. Examples of the conductor include copper, silver, gold, nickel, and the like. The adhesive is not limited to any particular adhesive as long as the adhesive is capable bonding the conductor to the base film 11, and various adhesives known in the art may be used. Examples of the deposition method include vapor deposition, plating, and the like. The conductor layer is preferably formed by bonding a copper foil to the base film 11 through a polyimide adhesive.

The conductive layer is then patterned to form a conductive pattern 12.

Patterning of the conductor layer may be performed by a method known in the art, such as photoetching. Photoetching is performed by forming a resist film with a predetermined pattern on one surface of the conductive layer, by subsequently treating the conductive layer exposed from the resist film with an etchant, and by removing the resist film.

Finally, the coverlay 13 is laminated to cover the conductive pattern 12, except for the terminal connecting area 12a situated on the same side as the one end edge of the conductive pattern 12. Specifically, an adhesive layer is laminated to the surface of the base film 11 having the conductive pattern 12 formed thereon, and a cover film is laminated on the adhesive layer. Alternatively, an adhesive layer may be pre-laminated to the cover film, and the surface of the cover film having the adhesive layer laminated thereon is placed in contact with, and bonded to, the conductive pattern 12.

Bonding of the cover film through an adhesive is typically effected by thermal compression bonding. The temperature and pressure at the time of thermal compression bonding may be determined depending on the type and composition of the adhesive used. This thermal compression bonding may be performed together with the thermal compression bonding of the reinforcement member 14 performed in the step of forming the reinforcement member which will be described below.

(Step of Forming Reinforcement Member)

The step of forming a reinforcement member laminates the reinforcement member 14 on the opposite surface of the base film 11 of the flexible printed circuit board core. The reinforcement member of the flexible printed circuit board 1 is composed of two reinforcement layers including the inner layer 14a and the outer layer 14b, so that the inner layer 14a and the outer layer 14b are sequentially laminated in this order on the opposite surface of the base film 11.

The method of lamination used herein may involve cutting the inner layer 14a to a desired size, placing an adhesive layer on the surface of the inner layer 14a, and laminating the obtained structure on the opposite surface of the base film 11 through the adhesive layer. The outer layer 14b may also be laminated on the surface of the inner layer 14a in the same or similar manner as the inner layer 14a. The inner layer 14a and the outer layer 14b then undergo thermal compression bonding under pressure and heat. This thermal compression bonding may be performed once after the outer layer 14b is laminated, or may be performed separately for each of the inner layer 14a and the outer layer 14b. Thermal compression bonding of the coverlay 13 may be performed concurrently therewith.

(Step of Mounting Connection Terminals)

The step of mounting connection terminals serves to mount the connection terminals 15 on the terminal connecting area 12a. The method of mounting the connection terminals 15 is not limited to a particular method as long as the connection terminals 15 are secured on the terminal connecting area 12a with electrical conduction enabled therebetween. For example, the employed method may involve disposing solders on the terminal connecting area 12a of the conductive pattern 12, placing the ends of the connection terminals 15 on the solder, and melting the solder for reflow soldering to solder the connection terminals 15 to the conductive pattern 12, or may involve swaging the base film 11 for each connection terminal 15 for connection, or may involve pressing the connection terminals 15 from above for compression bonding to the terminal connecting area 12a while establishing electrical connection. Through such means, the connection terminals 15 are mounted, so that the flexible printed circuit board 1 is made.

Advantage

The flexible printed circuit board 1 is configured such that the thickness of the reinforcement member 14 increases toward the one end edge of the conductive pattern 12 in a stepwise manner. As a result, the flexible printed circuit board 1 is thus strengthened in a stepwise manner toward the one end edge in the terminal connecting area 12a where the reinforcement member 14 is laminated opposite thereto. Strengthening the flexible printed circuit 1 board gradually toward the one end edge makes it easier to disperse stress, so that the flexible printed circuit board 1 can prevent factures caused by stress concentration resulting from the presence of the reinforcement member 14.

Second Embodiment

Figure 3:
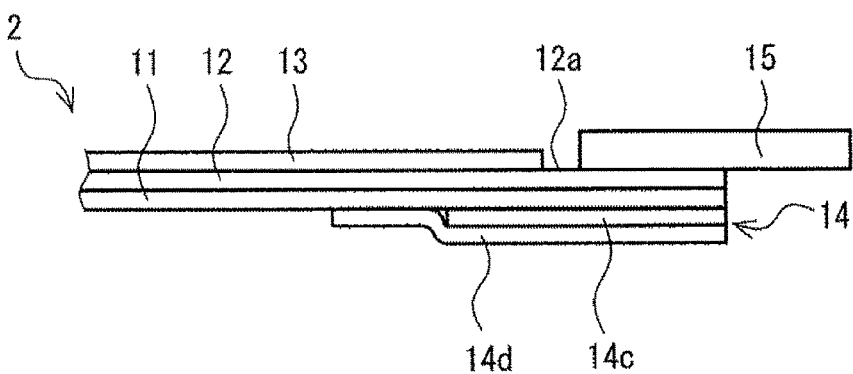
FIG. 3 is a schematic side elevation view of a flexible printed circuit board according to an aspect different from FIG. 1.

A flexible printed circuit board 2 according to a different aspect of the present disclosures illustrated in FIG. 3, different from the one illustrated in FIG. 1, includes a base film 11 having an insulating property, a conductive pattern 12 laminated to one surface of the base film 11, a coverlay 13 laminated to the one surface of the base film 11 or conductive pattern 12, and a reinforcement member 14 laminated to the opposite surface of the base film 11. The flexible printed circuit board 1 has a terminal connecting area 12a on and toward one end edge of the conductive pattern 12, and has a plurality of connection terminals 15 on the terminal connecting area 12a.

The configuration of the base film 11, the conductive pattern 12, the coverlay 13, and the connection terminals 15 for the flexible printed circuit board 2 of FIG. 3 may be the same as or similar to the configuration of the base film 11, the conductive pattern 12, the coverlay 13, and the connection terminals 15 for the flexible printed circuit board 1 of FIG. 1, respectively. Further, the configuration of the reinforcement member 14 for the flexible printed circuit board 2 of FIG. 3 is the same as or similar to the configuration of the reinforcement member 14 for the flexible printed circuit board 1 of FIG. 1, except for features based on the average lengths of the inner layer 14c and the outer layer 14d as described below. In consideration of this, the duplicate descriptions of the flexible printed circuit board 2 of FIG. 3 which overlap the descriptions of the flexible printed circuit board 1 of FIG. 1 will be omitted.

<Reinforcement Member>

With respect to the flexible printed circuit board 2, the average length of the inner layer 14c is smaller than the average length of the outer layer 14d. Because of this, the outer layer 14d is configured to cover the inner layer 14c, and the portion of the outer layer 14d in excess of the length of the inner layer 14c is laminated on the surface of the base film 11. With this arrangement, the reinforcement member 14 has a laminated number of layers increasing from 1 to 2 toward the noted one end edge, so that the thickness of the reinforcement member 14 increases toward the noted one end edge in a stepwise manner.

With respect to the flexible printed circuit board 2, the end edge of the inner layer 14c situated toward the opposite end edge of the conductive pattern 12 is positioned closer to the noted one end edge than is the end edge of the outer layer 14d situated toward the noted opposite end edge. Further, the respective end edges of the inner layer 14c and the outer layer 14d on the same side as the noted opposite end edge may not overlap, in a plan view, the end edge of the coverlay 13 situated on the same side as the noted one end edge.

Further, the end edge of the inner layer 14c on the same side as the noted opposite end edge may be positioned further toward the direction of the noted opposite end edge than is the end edge of the coverlay 13 situated on the same side as the noted one end edge. Further, the end edge of the inner layer 14c on the same side as the noted opposite end edge may be positioned further toward the direction of the noted opposite end edge than are the end edges of the connection terminals 15 situated on the same side as the noted opposite end edge.

Positioning the edge of the inner layer 14c on the same side as the noted opposite end edge in such an arrangement serves to more reliably protect the portion that is likely to receive stress.

Contact between the inner layer 14c and the base film 11, contact between the inner layer 14c and the outer layer 14d, and contact between the outer layer 14d and the base film 11 may be secured through adhesive layers, for example.

<Method of Making Flexible Printed Circuit Board>

The flexible printed circuit board 2 may be made by a production method including a step of forming a flexible printed circuit board core, a step of forming a reinforcement member, and a step of mounting connection terminals.

The step of forming a flexible printed circuit board core, the step of forming a reinforcement member, and the step of mounting connecting terminals may be the same as or similar to the respective steps of the method of making the flexible printed circuit board 1 illustrated in FIG. 1. It may be noted that the outer layer 14*d* to be laminated is longer than the inner layer 14*c* in the step of forming a reinforcement member, the portion of the outer layer 14*d* in excess of the length of the inner layer 14*c* is adhered to the surface of the base film 11.

Advantage

With respect to the flexible printed circuit board 2, the reinforcement member 14 is configured such that the outer layer 14*d* covers the inner layer 14*c*, so that the end edge of the inner layer 14*c* is not exposed to the outside of the flexible printed circuit board 2, thereby reducing a step edge on the opposite surface of the flexible printed circuit board 2. Accordingly, the reinforcement member 14 of the flexible printed circuit board 2 is unlikely to be peeled.

Other Embodiments

The embodiments disclosed herein should be regarded in all respects as examples only and as non-limiting. The scope of the present invention is defined by the claims without being limited to the configurations of the disclosed embodiments, and is intended to include all modifications within the spirit and equivalents of the scope of the claims.

The above-described embodiments have been directed to the case in which the reinforcement member is constituted by two reinforcement layers. The number of reinforcement layers is not limited to two, and may alternatively be three or more. Increasing the reinforcement member toward the one end edge in a stepwise manner by use of three or more reinforcement layers may further strengthen the stress mitigation effect. In view of relationships between the manufacturing cost and the resulting effects, the number of laminated layers is preferably five at the maximum.

In the case of the reinforcement layers are three or more layers, average separation distances between adjacent end edges of the reinforcement layers situated toward the opposite end edge of the conductive pattern may be equal to each other. Use of equal average separation distances between the adjacent end edges in this manner may more effectively disperse stress, thereby improving the fracture preventive effect.

Figure 4:
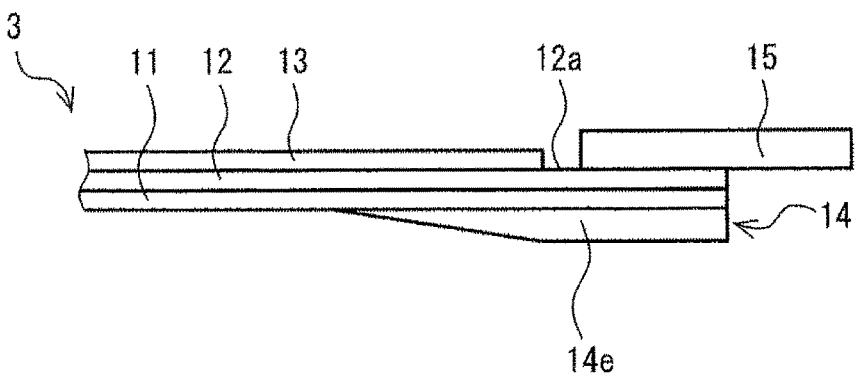
FIG. 4 is a schematic side elevation view of a flexible printed circuit board according to an aspect different from FIG. 1 and FIG. 3.

The above-described embodiments have been directed to the case in which the reinforcement member is constituted by a plurality of reinforcement layers. Alternatively, a flexible printed circuit board 3 may be configured such that the reinforcement member is constituted by a single reinforcement plate as illustrated in FIG. 4. In this case, the thickness of a reinforcement plate 14*e* is increased in a gradual manner toward the one end edge of the conductive pattern 12. FIG. 4 illustrates a case in which the thickness of the reinforcement plate 14*e* is linearly increased, but the way in which the thickness of the reinforcement plate 14*e* is increased is not limited to a particular mode as long as the increase is gradual.

Figure 5:
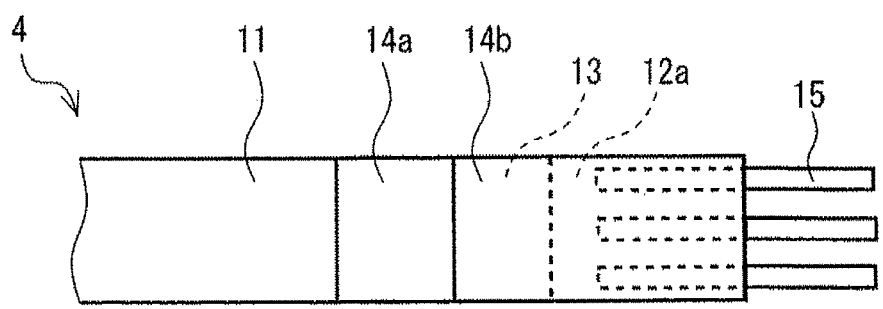
FIG. 5 is a schematic back view of a flexible printed circuit board according to an aspect different from FIG. 1, FIG. 3, and FIG. 4.

The above-described embodiment has been directed to a case in which the terminal connecting area has a comb shape, but the shape of the terminal connecting area is not limited to a comb shape. For example, the terminal connecting area 12*a* may have a rectangular shape in a plan view as in a flexible printed circuit board 4 illustrated in FIG. 5. FIG. illustrates a case in which the width of the terminal connecting area 12*a* is equal to the width of that part of the base film 11 which is other than the terminal connecting area 12*a*. In the case in which there is not a sufficient area for the connection terminals 15, for example, the width of the base film 11 on the one end edge may be expanded as in the case of the flexible printed circuit board 1 illustrated in FIG. 2.

Although the above-noted embodiments have been directed to as case in which a flexible printed circuit board is provided with a coverlay, the coverlay is not an essential component and may be omitted. Alternatively, an insulating layer of another configuration may be used to coat one surface of the base film or the conductive pattern, for example.

Although the above-noted embodiments have been directed to as case in which a flexible printed circuit board is provided with connection terminals, the connection terminals are not an essential component and may be omitted. A flexible printed circuit board having no connection terminals may be directly bonded to another flexible printed circuit board for connection to another electronic device, for example.

DESCRIPTION OF REFERENCE SYMBOLS 1, 2, 3, 4 flexible printed circuit board
11 base film
12 conductive pattern
12*a* terminal connecting area
13 coverlay
14 reinforcement member
14*a*, 14*c* inner layer
14*b*, 14*d* outer layer
14*e* reinforcement plate
15 connection terminals

What is claimed is:

1. A flexible printed circuit board which includes a base film having an insulating property and a conductive pattern laminated on one surface of the base film, and has a terminal connecting area toward one end edge of the conductive pattern, the flexible printed circuit board comprising:
    a reinforcement member laminated on another surface of the base film and situated opposite at least the terminal connecting area,
    wherein a thickness of the reinforcement member increases toward the one end edge in a stepwise manner,
    wherein the reinforcement member includes a plurality of laminated reinforcement layers each of which is made of a material having a resin as a main component, and
    wherein the thickness is increased in a stepwise manner based on a number of laminated layers among the reinforcement layers.

2. The flexible printed circuit board as claimed in claim 1, wherein the reinforcement layers are two layers including an inner layer and an outer layer, and
    wherein the outer layer covers the inner layer.

3. The flexible printed circuit board as claimed in claim 2, further comprising a coverlay laminated on the one surface of the base film or the conductive pattern, except on the terminal connecting area,
    wherein an end edge of the coverlay situated toward the one end edge does not overlap end edges of the reinforcement layers situated toward an opposite end edge of the conductive pattern in a plan view.

4. The flexible printed circuit board as claimed in claim 3, further comprising one or more connection terminals on the terminal connecting area,
    wherein the connection terminals are made of a metal.

5. The flexible printed circuit board as claimed in claim 2, further comprising one or more connection terminals on the terminal connecting area,
   wherein the connection terminals are made of a metal.

6. The flexible printed circuit board as claimed in claim 1, further comprising a coverlay laminated on the one surface of the base film or the conductive pattern, except on the terminal connecting area,
   wherein an end edge of the coverlay situated toward the one end edge does not overlap end edges of the reinforcement layers situated toward an opposite end edge of the conductive pattern in a plan view.

7. The flexible printed circuit board as claimed in claim 6, further comprising one or more connection terminals on the terminal connecting area,
   wherein the connection terminals are made of a metal.

8. The flexible printed circuit board as claimed in claim 1, further comprising one or more connection terminals on the terminal connecting area,
   wherein the connection terminals are made of a metal.

* * * * *